(12) United States Patent
Hoeckele

(10) Patent No.: US 8,598,593 B2
(45) Date of Patent: Dec. 3, 2013

(54) CHIP COMPRISING AN INTEGRATED CIRCUIT, FABRICATION METHOD AND METHOD FOR LOCALLY RENDERING A CARBONIC LAYER CONDUCTIVE

(75) Inventor: Uwe Hoeckele, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 134 days.

(21) Appl. No.: 13/184,346

(22) Filed: Jul. 15, 2011

(65) Prior Publication Data

US 2013/0015583 A1  Jan. 17, 2013

(51) Int. Cl.
*H01L 29/15* (2006.01)
*H01L 29/40* (2006.01)

(52) U.S. Cl.
USPC ............. 257/76; 257/77; 257/746; 438/105; 438/599; 438/660

(58) Field of Classification Search
USPC ............. 257/76, 77, 746; 438/105, 599, 660
See application file for complete search history.

(56) References Cited

U.S. PATENT DOCUMENTS

| | | | |
|---|---|---|---|
| 6,640,433 B1 | 11/2003 | Kuroda et al. | |
| 6,853,036 B1 * | 2/2005 | Rodov et al. | 257/355 |
| 7,009,253 B2 * | 3/2006 | Rodov et al. | 257/355 |
| 2005/0029596 A1 * | 2/2005 | Rodov et al. | 257/355 |
| 2006/0097323 A1 * | 5/2006 | Rodov et al. | 257/355 |
| 2011/0212566 A1 * | 9/2011 | Portico Ambrosio et al. | 438/69 |
| 2012/0170352 A1 * | 7/2012 | Le Neel et al. | 365/148 |
| 2012/0199985 A1 * | 8/2012 | Rathburn | 257/774 |
| 2012/0228758 A1 * | 9/2012 | Fedorov et al. | 257/734 |
| 2013/0017651 A1 * | 1/2013 | Standing et al. | 438/118 |

FOREIGN PATENT DOCUMENTS

| | | |
|---|---|---|
| DE | 10 2004 011 363 A1 | 9/2005 |
| DE | 10 2004 031 128 A1 | 1/2006 |
| DE | 10 2006 017 153 B3 | 8/2007 |
| JP | 2010-120819 A | 6/2010 |
| WO | WO 2004/070735 A1 | 8/2004 |

OTHER PUBLICATIONS

Krauser, J., et al., "Conductivity of Nanometer-sized Ion Tracks in Diamond Carbon Films," Journal of Applied Physics, vol. 94, No. 3, Aug. 1, 2003 pp. 1959-1964.

* cited by examiner

*Primary Examiner* — Ngan Ngo
(74) *Attorney, Agent, or Firm* — Slater & Matsil, L.L.P.

(57) ABSTRACT

A chip includes an integrated circuit and a carbonic layer. The carbonic layer includes a graphite-like carbon, wherein a lateral conducting path through the graphite-like carbon electrically connects two circuit elements of the integrated circuit.

20 Claims, 4 Drawing Sheets

CHIP COMPRISING AN INTEGRATED CIRCUIT, FABRICATION METHOD AND METHOD FOR LOCALLY RENDERING A CARBONIC LAYER CONDUCTIVE

TECHNICAL FIELD

This invention relates to a chip comprising an integrated circuit, to a fabrication method and to a method for locally rendering a carbonic layer conductive.

BACKGROUND

A chip usually comprises different layers formed on a substrate. The different layers may form a part of an integrated circuit such as interconnecting lines for circuit elements of the integrated circuit. In particular, the circuit elements are usually electrically connected to each other by conducting layers or conducting paths separated from each other by isolating layers. Such conducting paths are typically made of metal or polysilicon or other conducting materials. Methods for providing conducting paths, such as lift-off processes, result in embedding the paths in trenches of isolating layers. These methods comprise several processing steps for the embedding such as lithographic steps, structuring and chemical etching. One possibility is, for example, to fill trenches previously formed with conducting material, e.g., by a deposition process with a further step of chemical-mechanical polishing (CMP) in order to archive a planar surface of the isolation layer across the trenches after same have been filled with conducting material. Due to the several manufacturing steps the shown method for providing conducting paths is very labor intensive.

SUMMARY OF THE INVENTION

An embodiment of the invention provides a chip comprising an integrated circuit and a carbonic layer, wherein the carbonic layer comprises a graphite-like carbon, and wherein a lateral conducting path through the graphite-like carbon electrically connects to circuit elements of the integrated circuit.

A further embodiment of the invention provides a chip comprising a substrate, an integrated circuit and a carbonic layer on the substrate, wherein the carbonic layer comprises an isolated portion comprising amorphous carbon and a conducting portion comprising graphite-like carbon, and wherein a lateral conducting path through the graphite-like carbon electrically connects two circuit elements of the integrated circuit.

Some embodiments of the invention provide a method for locally rendering a carbonic isolating layer conductive, wherein the method comprises the following steps: directing a laser beam onto the carbonic isolating layer so as to convert amorphous carbon of the carbonic isolating layer into graphite-like carbon.

Some embodiments of the invention provide a method for fabricating a chip comprising an integrated circuit and a carbonic layer, wherein the method comprises the following steps: heating the carbonic layer so as to form a conducting portion of the layer, wherein a lateral path through the conducting portion connects two circuit elements of the integrated circuit.

BRIEF DESCRIPTION OF THE DRAWINGS

Embodiments according to the present invention will subsequently be discussed making reference to the enclosed figures in which.

DETAILED DESCRIPTION OF ILLUSTRATIVE EMBODIMENTS

Figure 1:
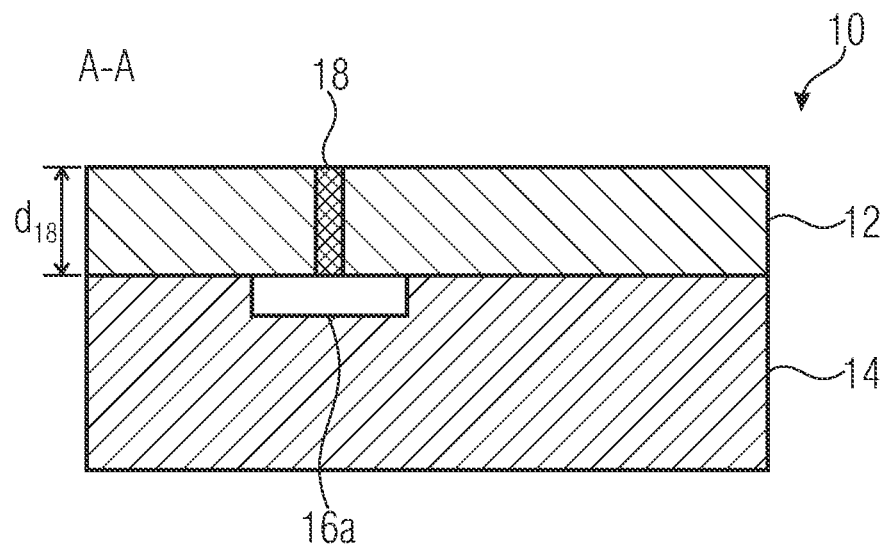
FIG. 1 shows a cross sectional view through two layers of a chip and a top view of the chip comprising two circuit elements according an embodiment.
Figure 1:
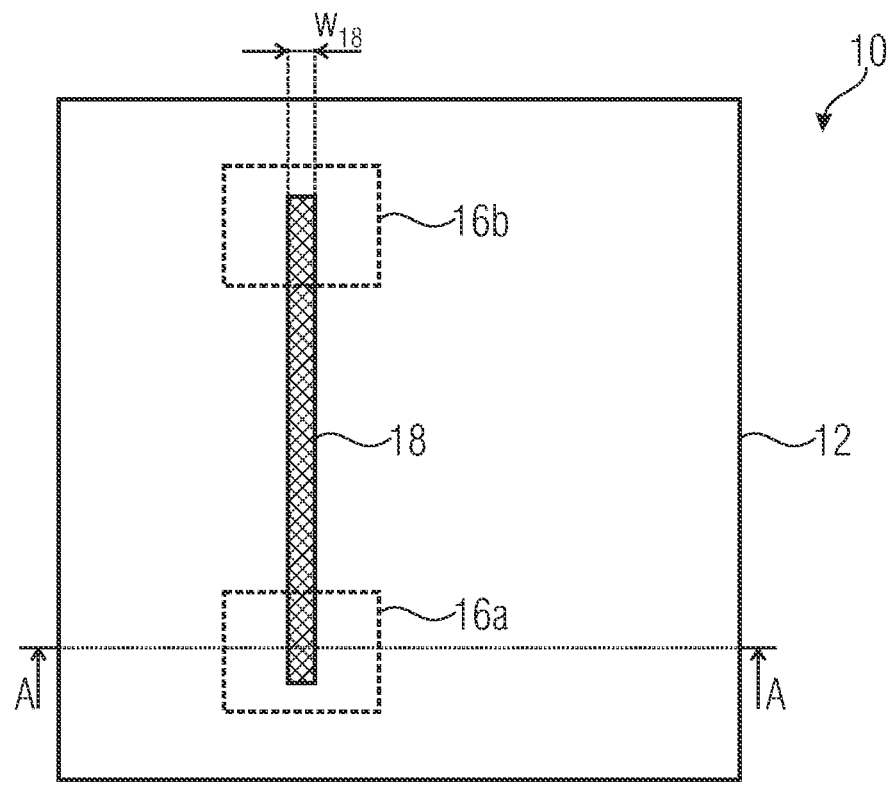

FIG. 1 shows a chip 10 comprising an integrated circuit and a carbonic layer 12 formed on a further layer 14. The carbonic layer 12 may, for example, comprise CoSi or $CoSi_2$. The integrated circuit is substantially formed within layer 14, but for illustration purpose, merely two circuit elements 16a and 16b thereof are shown in FIG. 1. Layer 14 may, for example, comprise a semiconductor substrate or a semiconductor stack of a substrate and further layers between the substrate and layer 12. The two circuit elements 16a and 16b are formed in the further layer 14 at laterally distinct portions, and may be, for example, a transistor, a capacitor and a diode, respectively. The circuit elements 16a and 16b are exemplarily shown as abutting an interface between layer 14 and layer 12. However, this is not necessary and alternatives will be shown hereinafter. Generally, the circuit elements 16a and 16b are connectable via lateral distinct portions of layer 12. At laterally surrounding portions, layer 14 has isolating material which electrically isolates the elements 16a and 16b, for example. The layer 12 has a thickness, e.g., 100 nm, and comprises a graphite-like carbon portion 18 which, in turn, may be surrounded by an isolating amorphous carbon portion of the layer 12. The isolating amorphous carbon portion of the layer 12 may, for example, comprise diamond-like carbon or be diamond-like carbon. The graphite-like carbon portion 18 in the layer 12 is illustratively shown to have the form of a line having a width $w_{18}$ which may, for example, be between 5 and 50 nm and a depth $d_{18}$ which may, for example, be between 3 and 300 nm. The graphite-like carbon portion 18 is arranged such that a lateral conducting path 18 through the graphite-like carbon electrically connects the two circuit elements 16a and 16b of the layer 14. In the embodiment of FIG. 1, the conducting path 18 continuously extends down to the surface of layer 12 interfacing to the lower layer 14 so that the conducting path 18 inherently interconnects all circuit elements 16a and 16b being connectable at portions of this surface overlapping the conducting path 18. However, alternative embodiments will be described below.

Thus, via the conducting path 18 an electrical current may be conducted, or control signals may be transmitted, from the circuit element 16a to the circuit element 16b of the integrated circuit, e.g., a logical circuit. The conducting path 18 through graphite-like carbon has an electrical conductivity, e.g., $0.5 \times 10^{10}$ U/cm², which depends on the width $w_{18}$ and depth $d_{18}$ of the conducting graphite-like carbon portion 18. The conductivity may be chosen to be sufficient for transmitting control signals and low currents, for example.

In the following, a method for providing the lateral conducting path 18 is described. The layer 14 comprising the two circuit elements 16a and 16b is provided. The first step of the method is then to provide the carbonic isolating layer 12 onto the layer 14. The carbonic isolating layer 12 thus provided may, for example, comprise amorphous carbon and diamond-like carbon, respectively. Vapor depositing may be used. The next step is to locally heat the carbonic isolating layer 12 in a lateral area where the lateral conducting path 18 should be provided. A grid structure of the amorphous carbon and the diamond-like carbon, respectively, is destroyed by the local heating so as to covert the amorphous carbon to graphite-like carbon in said area. A grid structure of the graphite-like carbon enables electrical conductivity of same. Thus, the carbonic isolating layer 12 is (locally) rendered conductive in the areas so as to generate the conducting path 18 via the graphite-like carbon portion 18. The local heating may be performed by using a diffusively radiating heat source or by directing a laser beam onto the portion 18 of the carbonic isolating layer 12. Generally, an area where the conversion should take place, may be scanned by the heat source by moving a local heat spot over this area, such as a laser spot, or by covering surrounding areas besides the area of interest against the heating, e.g., by use of a mask and irradiating layer 12 at the non-masked portion.

Dependent on the duration of directing the laser beam onto the carbonic isolating layer onto a certain location and dependent on a power of the laser beam the depth $d_{18}$ of the graphite-like carbon 18 may be adjusted. In other words, due to absorbance, the heat intensively decreased from the side of layer 12 facing the heat source and the heating may be stopped at a location of layer 12 prior to the layer 12 completely converted along depth direction. This is, the depth $d_{18}$ of the conduction path 18 may be equal to the thickness of the layer 12, as shown in FIG. 1.

The thickness of the carbonic layer 12 and thus the depth $d_{18}$ of the portion 18 and the depth of the portion of amorphous carbon are constant. The described method does not change the topology of the layer 12 and thus main surfaces of the layer 12 are plane or approximately plane. The graphite-like carbon 18 may have the width $w_{18}$ which is smaller compared to the width of the connecting areas of the circuit elements 16a and 16b at the interface between the layer 12 and 14. The width $w_{18}$ of the graphite-like carbon portion 18 may be adjusted by varying the frequency of the laser or by varying a diameter of the laser beam. Alternatively, the width $w_{18}$ may be increased by providing two adjacent graphite-like carbon portions such that a broad graphite-like carbon portion is formed.

It is beneficial that the conducting path 18 may be provided by a simple and cost efficient method. A further advantage is that this method enables providing structured conductive paths embedded in the isolating layer 12 directly, without the need for a further step of planarization the surface of the layer 12, e.g., before providing further layers. Therefore, the mechanical stress for the chip 10 caused by filling trenches and by the planarization process is reduced.

Figure 2:
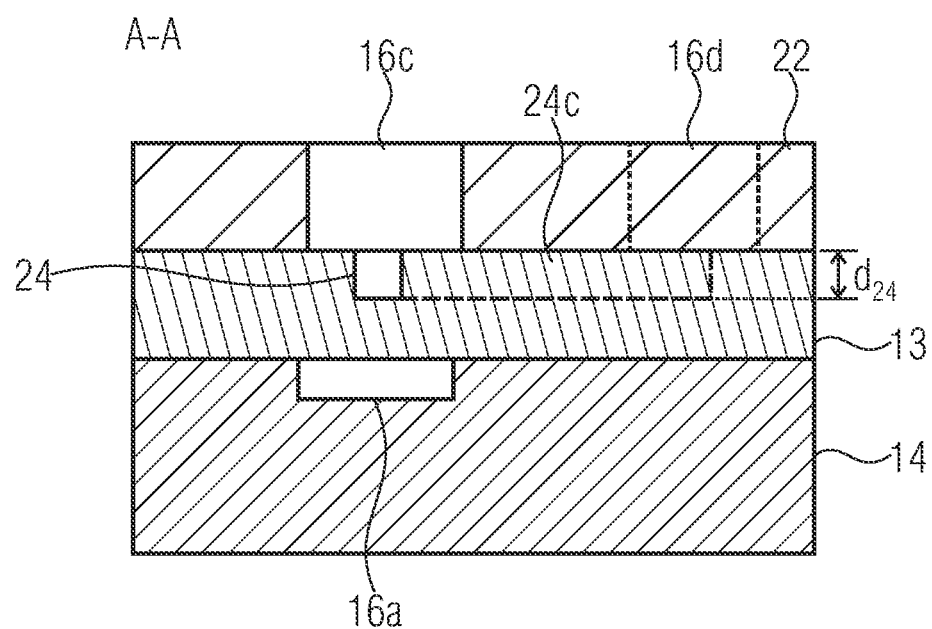
FIG. 2 shows a cross sectional view through three layers of a chip and a top view of the chip comprising two circuit elements according to an embodiment.
Figure 2:
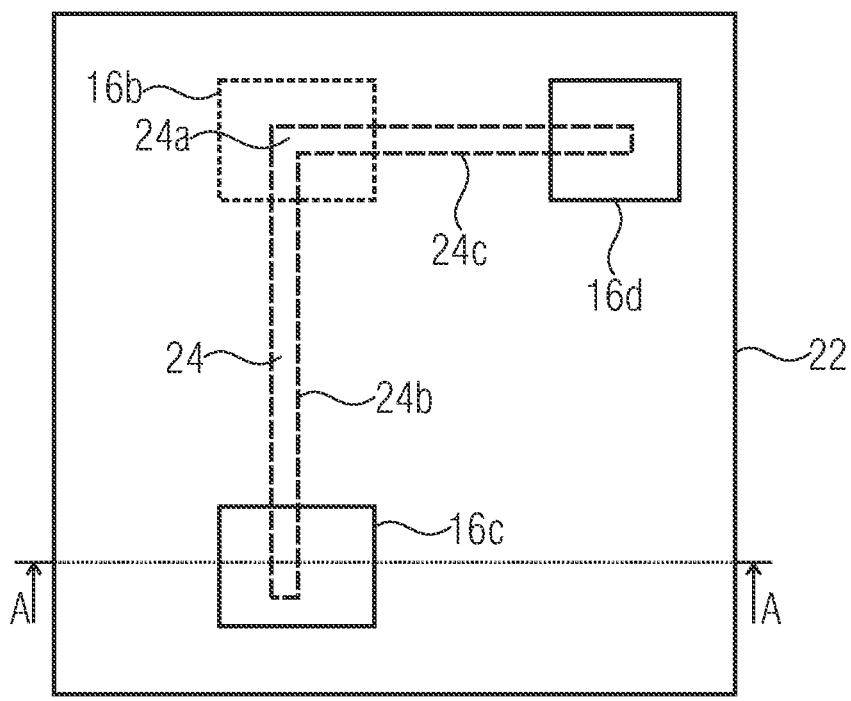

In FIG. 2, a graphite-like carbon portion having a reduced depth when compared to the embodiment of FIG. 1 is discussed. FIG. 2 shows a further embodiment of a chip having three layers. A carbonic isolating layer 13 is arranged between the layer 14 and a layer 22. The first layer 14 at the first side of the layer 13 is equal to the layer 14 of the first embodiment. The second layer 22 at a second side of the layer 13 comprises two circuit elements 16c and 16d. The circuit elements 16c and 16d are formed on, or have connectable areas at, a surface of the upper layer 22 facing the layer 13. The layer 13 comprises amorphous carbon and graphite-like carbon which occupy laterally distinct areas of the carbonic layer 13. In this embodiment, the lateral conducting path 24 through the graphite-like carbon electrically connects the two circuit elements 16c and 16d. A first part 24b of the graphite-like carbon portion 24 extends in a first lateral direction (in parallel with the layer stack) so as to extend between the position of the circuit element 16c and a point 24a. A second part 24c extends in a second lateral direction through the layer 13, i.e. between the position of the circuit element 16d and the point 24a. That is, the conducting path 24 is shown in FIG. 2 illustratively to have a non-straight form. Differing from the embodiment of FIG. 1, the graphite-like carbon of the lateral conducting path 24 merely extends down to a depth $d_{24}$ which is smaller than the thickness of the carbonic layer 13 so that the circuit elements 16c and 16d are not electrically connected to each other by the conducting path 24. That is, the conducting path 24 is embedded in the isolating amorphous carbon of the layer 13 merely at one side of layer 13, and as the connecting areas of the circuit element 16c and 16d are located at opposite sides of the layer 13. Some are not electrically connected via the path 24, although path 24 overlaps both connecting areas. To be precise, circuit element 16c is separated from the conducting path 24 via the isolating amorphous carbon portion along the thickness direction.

The graphite-like carbon of the conducting path 24 may be provided by local heating of the carbonic layer 13, for example, by directing a laser beam onto the carbonic isolating layer 13, as described above. In contrast to the embodiment of FIG. 1, the local heating of the carbonic layer 13 is performed by using a lower energy density of the laser compared to the embodiment of FIG. 1, for example. Alternatively, instead of reducing the power of the laser, the duration of directing the laser beam onto the layer 13 may be varied. The reduced power density of the laser or the shorter duration of directing the laser beam results in the reduced depth $d_{24}$ of the graphite-like carbon portion 24 when compared to the depth $d_{18}$ (see FIG. 1). In other words, the method enables forming the lateral conducting path 24 in the carbonic isolating layer 13 by using the laser, wherein the depth $d_{24}$ of the conducting path 24 is adjustable.

The layer 22 comprising the two circuit elements 16c and 16d may be provided before or after converting the amorphous carbon of the carbonic isolating layer into graphite-like carbon 24. In the latter case, in this embodiment, the step of directing the laser beam onto the carbonic isolating layer 13 may be performed so that the laser beam travels through the layer 22 before impinging onto the carbonic isolating layer 13 in the area of the portion 24. Here, parameters of the laser, e.g., frequency and power density, may be set such that the amorphous carbon of the layer 13 in the area of the portion 24 is converted into a graphite-like carbon while the characteristic of the layer 22 is not changed.

Figure 3:
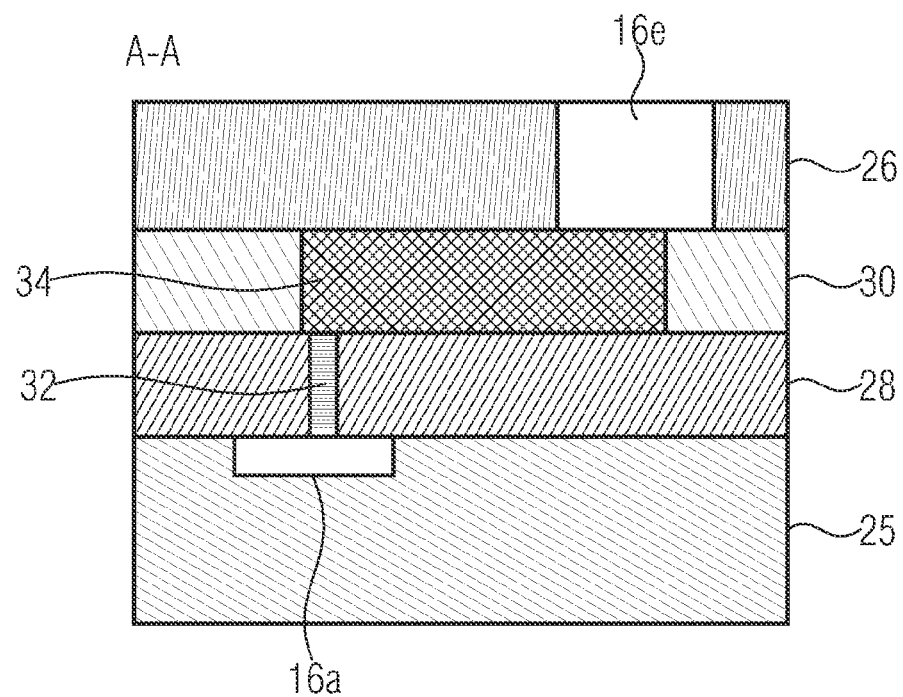
FIG. 3 shows a cross sectional view through four layers of a chip and a top view of the chip comprising two circuit elements according to an embodiment.
Figure 3:
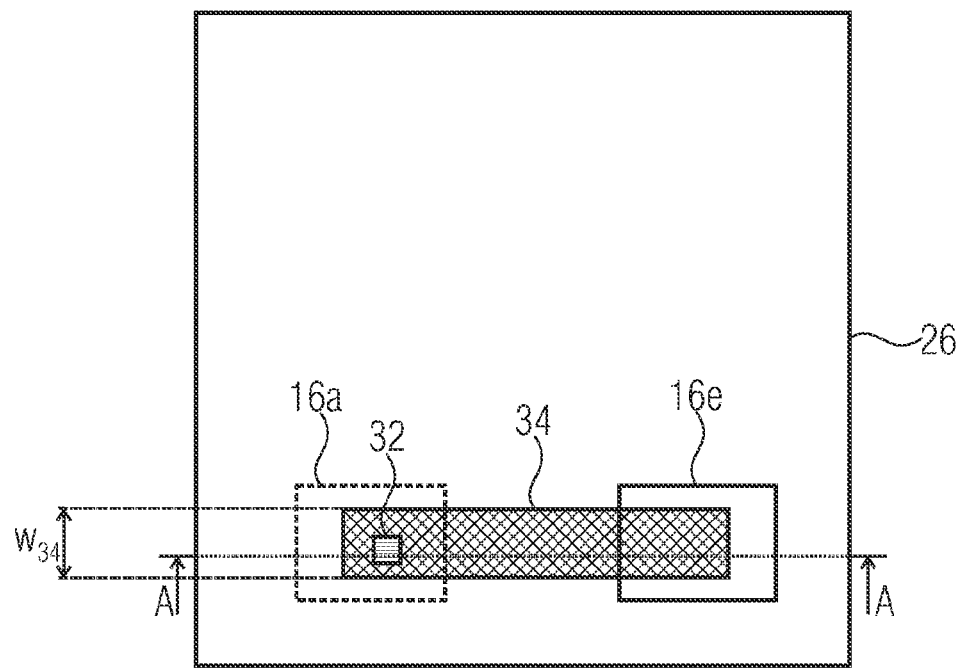

FIG. 3 illustrates a graphite-like carbon portion providing a lateral and vertical conducting path. FIG. 3 shows an embodiment of a chip having four layers. A layer 25 comprises the first circuit element 16a while a layer 26 comprises the second circuit element 16e. Between the layers 25 and 26 two isolating layers 28 and 30 are arranged. The isolating layer 28 comprises a via 32. The layer 30 is a carbonic layer comprising an amorphous carbon portion and a conductive graphite-like carbon portion 34. The lateral conducting path 34 electrically connects the circuit element 16e arranged at a surface of the layer 26 facing layer 28 to the via 32 of the layer 28. The via 32 is electrically connected to the circuit element 16a arranged at a surface of the layer 25 facing layer 30. Thus, the via 32 and the conducting path 34 laterally and vertically connect the two circuit elements 16a and 16e, i.e., through the two layers 28 and 30 and through the layer stack, respectively, and in parallel with the layers 25, 26, 28, 30.

The layer 30 may be provided and locally rendered conductive, as described above. The width $w_{34}$ of the graphite-like carbon portion 34 is shown exemplarily as being increased when compared to the width $w_{18}$ of the graphite-like carbon portion 18 according to the embodiment of FIG. 1. As a consequence of this, the electrical conductivity of the conduction path 34 is increased when compared to the conduction path 18 according to FIG. 1. The depth of the graphite-like carbon portion 34 extends over the whole thickness of the layer 30 in order to provide an electrical connection in a vertical direction from the via 32 in the lower layer 28 to the circuit element 16e in the upper layer 26.

Figure 4:
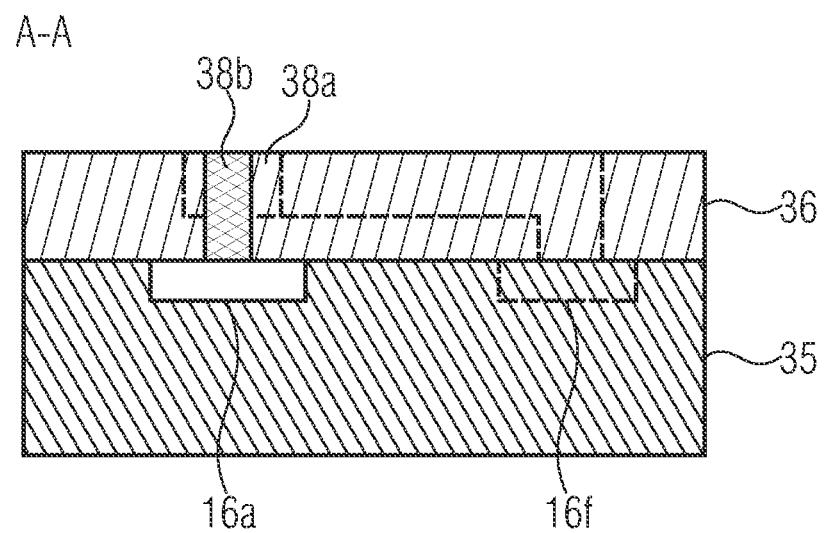
FIG. 4 shows a cross sectional view through two layers of a chip and a top view of the chip comprising two circuit elements and a contact pad according to an embodiment.
Figure 4:
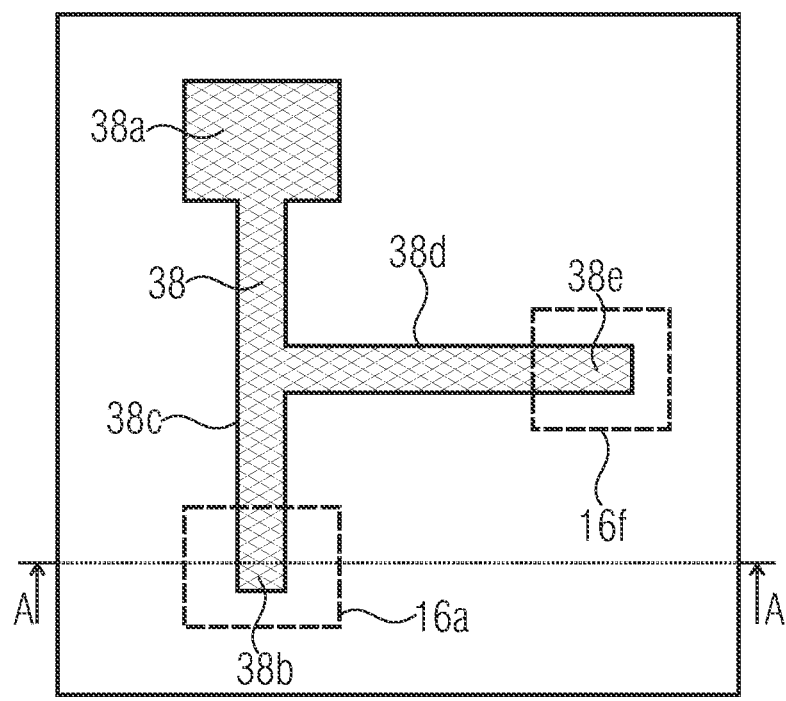

FIG. 4 illustrates a graphite-like carbon portion having a bifurcation and different depths at different locations of the graphite-like carbon portion. FIG. 4 shows a further embodiment having two layers 35 and 36. The layer 35 comprises two circuit elements 16a and 16f which are arranged at a surface of the layer 35 facing the layer 36. The carbonic layer 36 comprises a first portion of amorphous carbon and a second portion of graphite-like carbon 38 embedded in the amorphous carbon portion. The circuit element 16a is electrically connected via a conducting path 38 in a first lateral direction through the graphite-like carbon 38 to a contact pad 38a which is formed as a locally laterally enlarged portion of the graphite-like carbon. Via this contact pad 38a the chip may be electrically connected by a further via of a further (upper) layer arranged at a surface of layer 36. The enlarged shape of the contact pad 38a enables, for example, accommodating positioning imprecision of the further layer or the further via, such as by lithographic processes used for defining the via. The contact pad 38a has a geometry that is exemplarily square-shape and a part 38c of the graphite-like carbon between the via 38b and a position of the circuit element 16a at an area 38b extends down to a depth which is smaller than the thickness of the layer 36. The depth of the graphite-like carbon portion 38 extends over the whole thickness of the carbonic layer 36 in the area 38b at the circuit element 16a in order to electrically connect the circuit element 16a via the surface of the layer 36.

The graphite-like carbon 38 comprises further a second part 38d in a second lateral direction. A lateral conducting path through the second part 38d of the graphite-like carbon electrically connects the circuit element 16f to the circuit element 16a and thus to the contact pad 38a. Therefore, the graphite-like carbon 38 in an area 38e at the circuit element 16f extends over the whole thickness of the layer 36 while the depth of the part 38d of the graphite-like carbon 38 is smaller than the thickness of the layer 36.

The carbonic layer 36 may be locally rendered conductive in the portion 38, as described with respect to the embodiment of FIG. 1. The depth differences between the areas 38a, 38c and 38b as well as the depth differences between the areas 38d and 38e may, for example, be the result of using a different power density of the laser at different locations. The square shaped geometry of the contact pad 38a or, in other words, the extensive surface of the contact pad 38a may be generated by providing a plurality of adjacent graphite-like carbon portions.

According to another embodiment, instead of local heating laterally global heating may be performed so that a whole surface area of the carbonic isolating layer or an extensive area of the layer is converted into graphite-like carbon. This step may, for example, be performed by using an oven. Alternatively, the local heating may be performed by another heating source or by an ion source. It is beneficial that the extensive heating of the layer does not cause deformations of the layer or of a substrate.

Although some aspects have been described in the context of a method, these aspects also correspond to the chip 10 (see FIG. 1) comprising the carbonic layer 12 which comprises the conductive graphite-like carbon portion 18, wherein the lateral conducting path 18 through the graphite-like carbon 18 electrically connects to circuit elements 16a and 16b of the integrated circuit. As illustrated with respect to FIG. 1, the chip 10 may comprise an isolating portion which comprises amorphous carbon in which the graphite-like carbon 18 is embedded. The chip 10 may further comprise a substrate.

Although in some embodiments the circuit elements (e.g., 16a, 16b) and the conducting paths (e.g., 18) have been shown in a different layer (e.g., 12, 14), the invention also relates to embodiments in which at least one of the circuit elements and the graphite-like carbon of the conducting path are arranged in the same layer.

What is claimed is:

1. A chip comprising:
   an integrated circuit; and
   a carbonic layer, wherein the carbonic layer comprises a graphite-like carbon, wherein a lateral conducting path through the graphite-like carbon electrically connects two circuit elements of the integrated circuit, and wherein the carbonic layer comprises an isolating portion that comprises amorphous carbon surrounding and abutting the graphite-like carbon.

2. The chip of claim 1, wherein the graphite-like carbon and amorphous carbon occupy laterally distinct areas of the carbonic layer and both extend over a whole thickness of the carbonic layer.

3. The chip of claim 1, wherein the graphite-like carbon extends down to a depth of the carbonic layer smaller than the thickness of the carbonic layer so as to be embedded in the amorphous carbon.

4. The chip of claim 1, wherein the thickness of the carbonic layer is laterally constant.

5. The chip of claim 1, wherein the two circuit elements comprise logic circuits.

6. The chip of claim 1, wherein a first one of the two circuit elements is a transistor and a second one of the two circuit elements is an element selected from the group consisting of a contact pad, a transistor, a capacitor and a diode.

7. A chip comprising:
   a substrate;
   an integrated circuit; and
   a carbonic layer over the substrate;
   wherein the carbonic layer comprises an isolating portion comprising amorphous carbon and a conducting portion comprising graphite-like carbon; and
   wherein a lateral conducting path through the graphite-like carbon electrically connects two circuit elements of the integrated circuit.

8. A method of making a chip, the method comprising:
   forming a carbonic layer over an integrated circuit, the carbonic layer comprising amorphous carbon; and
   directing a laser beam onto the carbonic layer so as to convert the amorphous carbon of the carbonic layer into graphite-like carbon;
   wherein after directing the laser beam the chip comprises the integrated circuit and the carbonic layer, wherein the carbonic layer comprises the graphite-like carbon, wherein a lateral conducting path through the graphite-like carbon electrically connects two circuit elements of the integrated circuit, and wherein the carbonic layer comprises an isolating portion that comprises amorphous carbon surrounding and abutting the graphite-like carbon.

9. The method of claim 8, wherein directing the laser beam onto the carbonic layer is performed so that the laser beam travels through a further layer before impinging onto the carbonic isolating layer.

10. A method for fabricating a chip comprising an integrated circuit and a carbonic layer, the method comprising:
heating the carbonic layer so as to form a conducting portion of the layer, wherein a lateral path through the conducting portion connects two circuit elements of the integrated circuit;
wherein after heating the carbonic layer the chip comprises the integrated circuit and the carbonic layer, wherein the carbonic layer comprises graphite-like carbon, wherein the lateral conducting path through the graphite-like carbon electrically connects the two circuit elements of the integrated circuit, and wherein the carbonic layer comprises an isolating portion that comprises amorphous carbon surrounding and abutting the graphite-like carbon.

11. The method of claim 10, further comprising providing the carbonic layer on a substrate.

12. The method of claim 11, wherein providing the carbonic layer is performed such that the carbonic layer comprises amorphous carbon.

13. The method of claim 10, wherein heating the carbonic layer comprises locally heating the carbonic layer.

14. The method of claim 10, wherein heating the carbonic layer comprises using a laser.

15. The method of claim 10, wherein heating the carbonic layer comprises using an oven.

16. The method of claim 12, wherein the heating is performed such that amorphous carbon is converted into graphite-like carbon surrounded by amorphous carbon.

17. The method of claim 16, wherein the heating is performed such that amorphous carbon and graphite-like carbon occupy laterally distinct areas of the carbonic layer and both extend over a whole thickness of the carbonic layer.

18. The method of claim 16, wherein the heating is performed such that the graphite-like carbon extends down to a depth of the carbonic layer smaller than a thickness of the carbonic layer and is embedded in the amorphous carbon.

19. The method of claim 17, wherein the thickness of the carbonic layer is laterally constant.

20. The method of claim 13, wherein locally heating is performed such that the lateral path connects the two circuit elements, wherein a first one of the two circuit elements is a transistor or a logical circuit and a second one of the two circuit elements is one of a group consisting of a contact pad, a logical circuit, a transistor, a capacitor and a diode.

* * * * *